US012074616B2

(12) United States Patent
Kanno et al.

(10) Patent No.: US 12,074,616 B2
(45) Date of Patent: *Aug. 27, 2024

(54) SEMICONDUCTOR MEMORY DEVICE AND METHOD OF CONTROLLING THE SAME

(71) Applicant: Kioxia Corporation, Tokyo (JP)

(72) Inventors: Shinichi Kanno, Tokyo (JP); Hironori Uchikawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/148,060

(22) Filed: Dec. 29, 2022

(65) Prior Publication Data

US 2023/0139971 A1    May 4, 2023

Related U.S. Application Data

(60) Continuation of application No. 17/317,280, filed on May 11, 2021, now Pat. No. 11,575,395, which is a continuation of application No. 16/357,696, filed on Mar. 19, 2019, now Pat. No. 11,038,536, which is a continuation of application No. 15/421,746, filed on Feb. 1, 2017, now abandoned, which is a continuation
(Continued)

(30) Foreign Application Priority Data

Aug. 31, 2007   (JP) ................. 2007-225996

(51) Int. Cl.
*H03M 13/29* (2006.01)
*G06F 11/10* (2006.01)
(Continued)

(52) U.S. Cl.
CPC ......... *H03M 13/2906* (2013.01); *G06F 11/10* (2013.01); *G06F 11/1004* (2013.01);
(Continued)

(58) Field of Classification Search
CPC ........ G06F 11/10; G06F 3/06; G06F 11/1068; G06F 11/1008; G06F 11/1004;
(Continued)

(56) References Cited

U.S. PATENT DOCUMENTS 5,734,663 A    3/1998 Eggenberger
6,256,762 B1    7/2001 Beppu
(Continued)

FOREIGN PATENT DOCUMENTS

EP    0 176 218 A2    4/1986
JP    63-275225    11/1988
(Continued)

OTHER PUBLICATIONS

Rossi, D.; Metra, C.; Ricco B., "Fast and compact error correcting scheme for reliable multilevel flash memories," Memory Technology, Design and Testing, 2002. (MTDT 2002). Proceedings of the 2002 IEEE International Workshop on, vol.; No., pp. 27, 31, 2002.
(Continued)

*Primary Examiner* — Cynthia Britt
(74) *Attorney, Agent, or Firm* — Oblon, McClelland, Maier & Neustadt, L.L.P.

(57) ABSTRACT

A semiconductor memory device includes a plurality of detecting code generators configured to generate a plurality of detecting codes to detect errors in a plurality of data items, respectively, a plurality of first correcting code generators configured to generate a plurality of first correcting codes to correct errors in a plurality of first data blocks, respectively, each of the first data blocks containing one of the data items and a corresponding detecting code, a second correcting code generators configured to generate a second correcting code to correct errors in a second data block, the second data block containing the first data blocks, and a semiconductor memory configured to nonvolatilely store the second data block, the first correcting codes, and the second correcting code.

20 Claims, 8 Drawing Sheets

Related U.S. Application Data of application No. 14/920,510, filed on Oct. 22, 2015, now abandoned, which is a continuation of application No. 14/601,664, filed on Jan. 21, 2015, now Pat. No. 9,384,090, which is a continuation of application No. 14/231,140, filed on Mar. 31, 2014, now Pat. No. 8,959,411, which is a continuation of application No. 13/757,935, filed on Feb. 4, 2013, now Pat. No. 8,732,544, which is a division of application No. 13/465,624, filed on May 7, 2012, now Pat. No. 8,386,881, which is a continuation of application No. 13/090,539, filed on Apr. 20, 2011, now Pat. No. 8,196,008, which is a continuation of application No. 12/404,861, filed on Mar. 16, 2009, now Pat. No. 8,117,517, which is a continuation of application No. PCT/JP2008/063344, filed on Jul. 17, 2008.

(51) Int. Cl.
*G06F 13/16* (2006.01)
*G06F 13/40* (2006.01)
*G11C 29/52* (2006.01)
*H03M 13/00* (2006.01)
*H03M 13/03* (2006.01)
*H03M 13/35* (2006.01)

(52) U.S. Cl.
CPC ...... *G06F 11/1008* (2013.01); *G06F 11/1068* (2013.01); *G06F 13/1673* (2013.01); *G06F 13/4068* (2013.01); *G11C 29/52* (2013.01); *H03M 13/29* (2013.01); *H03M 13/35* (2013.01); *H03M 13/6561* (2013.01); *H03M 13/03* (2013.01); *Y02D 10/00* (2018.01)

(58) Field of Classification Search
CPC ............ G06F 13/4068; G06F 13/1673; H03M 13/2906; H03M 13/29; H03M 13/35; H03M 13/03; H03M 13/6561; G11C 29/52; Y02D 10/14; Y02D 10/151
See application file for complete search history.

(56) References Cited

U.S. PATENT DOCUMENTS

| | | | |
|---|---|---|---|
| 6,510,537 B1 | 1/2003 | Lee | |
| 6,651,212 B1 | 11/2003 | Katayama et al. | |
| 6,938,193 B1 | 8/2005 | Honda | |
| 7,239,547 B2 | 7/2007 | Suda | |
| 7,259,997 B2 | 8/2007 | You | |
| 7,409,623 B2 | 8/2008 | Baker et al. | |
| 7,508,704 B2 | 3/2009 | Honma et al. | |
| 7,551,478 B2 | 6/2009 | Kanno | |
| 7,590,919 B2 | 9/2009 | Kanno | |
| 7,730,357 B2 | 6/2010 | Micheloni et al. | |
| 7,900,117 B2 | 3/2011 | Kanno | |
| 7,941,696 B2 | 5/2011 | Frost et al. | |
| 7,984,325 B2 | 7/2011 | Fukutomi et al. | |
| 8,010,876 B2 | 8/2011 | Hsieh et al. | |
| 8,065,482 B2 | 11/2011 | Sato et al. | |
| 8,069,301 B2 | 11/2011 | Fukutomi et al. | |
| 8,069,394 B2 | 11/2011 | Kanno | |
| 8,086,933 B2 | 12/2011 | Yamaga | |
| 8,112,692 B2 | 2/2012 | Lee et al. | |
| 8,117,517 B2 | 2/2012 | Kanno | |
| 8,140,935 B2* | 3/2012 | Hong ................ | H03M 13/2906 714/755 |
| 8,196,008 B2 | 6/2012 | Kanno | |
| 8,276,043 B2 | 9/2012 | Yano et al. | |
| 8,296,620 B2 | 10/2012 | Chen et al. | |
| 8,335,960 B2* | 12/2012 | Zhang ................ | G06F 11/1008 714/763 |
| 8,341,497 B2 | 12/2012 | Fukutomi et al. | |
| 8,386,881 B2 | 2/2013 | Kanno | |
| 8,468,415 B2 | 6/2013 | Radke | |
| 8,732,544 B2 | 5/2014 | Kanno | |
| 8,959,411 B2 | 2/2015 | Kanno | |
| 9,384,090 B2 | 7/2016 | Kanno | |
| 11,038,536 B2* | 6/2021 | Kanno ................ | G06F 13/4068 |
| 11,575,395 B2* | 2/2023 | Kanno ................ | H03M 13/29 |
| 2001/0028523 A1 | 10/2001 | Moro et al. | |
| 2002/0157044 A1 | 10/2002 | Byrd | |
| 2002/0174397 A1* | 11/2002 | Furukawa ........... | G06F 11/1072 714/764 |
| 2003/0041299 A1 | 2/2003 | Kanazawa et al. | |
| 2004/0015771 A1 | 1/2004 | Lasser et al. | |
| 2005/0172207 A1 | 8/2005 | Radke et al. | |
| 2005/0210361 A1 | 9/2005 | Nagai | |
| 2005/0268203 A1 | 12/2005 | Keays et al. | |
| 2005/0281113 A1 | 12/2005 | Yada et al. | |
| 2006/0085722 A1 | 4/2006 | Watanabe et al. | |
| 2006/0107130 A1 | 5/2006 | Baker et al. | |
| 2006/0156189 A1 | 7/2006 | Tomlin | |
| 2006/0256615 A1 | 11/2006 | Larson | |
| 2006/0282717 A1 | 12/2006 | Suda | |
| 2007/0089033 A1 | 4/2007 | Zeevi | |
| 2007/0094571 A1 | 4/2007 | Lee | |
| 2007/0130496 A1 | 6/2007 | Kanno | |
| 2007/0157064 A1 | 7/2007 | Falik et al. | |
| 2007/0174740 A1 | 7/2007 | Kanno | |
| 2007/0226588 A1 | 9/2007 | Lee et al. | |
| 2007/0226590 A1 | 9/2007 | Nagai | |
| 2007/0268905 A1 | 11/2007 | Baker et al. | |
| 2008/0086677 A1 | 4/2008 | Yang et al. | |
| 2008/0163023 A1 | 7/2008 | Hong et al. | |
| 2008/0168319 A1 | 7/2008 | Lee et al. | |
| 2008/0235560 A1 | 9/2008 | Colmer et al. | |
| 2009/0150749 A1 | 6/2009 | Kim et al. | |
| 2009/0222708 A1 | 9/2009 | Yamaga | |
| 2009/0241010 A1 | 9/2009 | Yano et al. | |
| 2009/0327604 A1 | 12/2009 | Sato et al. | |
| 2009/0327802 A1 | 12/2009 | Fukutomi et al. | |
| 2009/0327803 A1 | 12/2009 | Fukutomi et al. | |
| 2010/0005228 A1 | 1/2010 | Fukutomi et al. | |
| 2010/0161885 A1 | 6/2010 | Kanno et al. | |
| 2010/0223531 A1 | 9/2010 | Fukutomi et al. | |
| 2010/0313099 A1 | 12/2010 | Yamaga | |
| 2011/0119561 A1 | 5/2011 | Lee et al. | |
| 2011/0185254 A1 | 7/2011 | Radke et al. | |
| 2012/0011416 A1 | 1/2012 | Hong et al. | |
| 2012/0030545 A1 | 2/2012 | Radke | |
| 2012/0166906 A1 | 6/2012 | Nagadomi et al. | |
| 2014/0047298 A1 | 2/2014 | Radke | |
| 2023/0139971 A1* | 5/2023 | Kanno ............. | H03M 13/2906 714/758 |

FOREIGN PATENT DOCUMENTS

| | | |
|---|---|---|
| JP | 07-248930 | 9/1995 |
| JP | 10-97471 A | 4/1998 |
| JP | 2000-101447 A | 4/2000 |
| JP | 2000-181807 | 6/2000 |
| JP | 2000-269824 | 9/2000 |
| JP | 2003-196165 | 7/2003 |
| JP | 2004-501466 | 1/2004 |
| JP | 2005-216437 | 8/2005 |
| JP | 2007-299449 | 11/2007 |
| JP | 2000-9059422 A | 3/2009 |
| JP | 2009-080651 A | 4/2009 |
| JP | 2009-211742 A | 9/2009 |
| JP | 2010-238363 A | 10/2010 |
| WO | WO 01/98872 A2 | 12/2001 |
| WO | WO 2007/036834 A2 | 4/2007 |

OTHER PUBLICATIONS

Godard, B.; Daga, J.-M.; Torres, L.; Sassatelli, G., "Architecture for Highly Reliable Embedded Flash Memories," Design and Diagnostics of Electronic Circuits and Systems, 2007. DDECS '07, IEEE, vol.; No.; pp. 1, 6, Apr. 11-13, 2007.

(56) References Cited

OTHER PUBLICATIONS

Gregori, S.: Khouri, O.; Micheloni, R.: Torelli, G., "An error control code scheme for multilevel Flash memories," Memory Technology, Design and Testing, IEEE International Workshop on 2001., vol., No., pp. 45, 49, 2001.
Office Action issued on Mar. 11, 2016 in European Patent Application No. 08 791 594.8.
D. Rossi, C. Metra and B. Ricco, "Fast and compact error correcting scheme for reliable multilevel flash memories," Proceedings of the Eighth IEEE International On-Line Testing Workshop (IOLTW 2002), Isle of Bendor, France, 2002, pp. 221-225. (Year: 2002).
S. Gregori, A. Cabrini, 0. Khouri and G. Torelli, "On-chip error correcting techniques for new-generation flash memories," in Proceedings of the IEEE, vol. 91, No. 4, pp. 602-616, Apr. 2003. (Year: 2003).
A. N. Aravind, V. Anandi, B. Mirji and R. Pramod, "Optimizing chien search in BCH decoder," 2016 IEEE International Conference on Recent Trends in Electronics, Information & Communication Technology (RTEICT), Bangalore, India, 2016, pp. 422-425. (Year: 2016).
A. Wahbi et al."A New Embedded Chien Search Block for Reed-Solomon (RS) Codes based on Factorization of Error Locator Polynomial," 2020 International Conference on Intelligent Systems and Computer Vision (ISCV), Fez, Morocco, 2020, pp. 1-5. (Year : 2020).
E. H. El Idrissi Anas, E. Rachid and H. Lamari, "A low power error detection in the Chien Search Block for Reed-Solomon code," 2012 IEEE International Conference on Complex Systems (ICCS), Agadir, Morocco, 2012, pp. 1-3. (Year: 2012).

\* cited by examiner

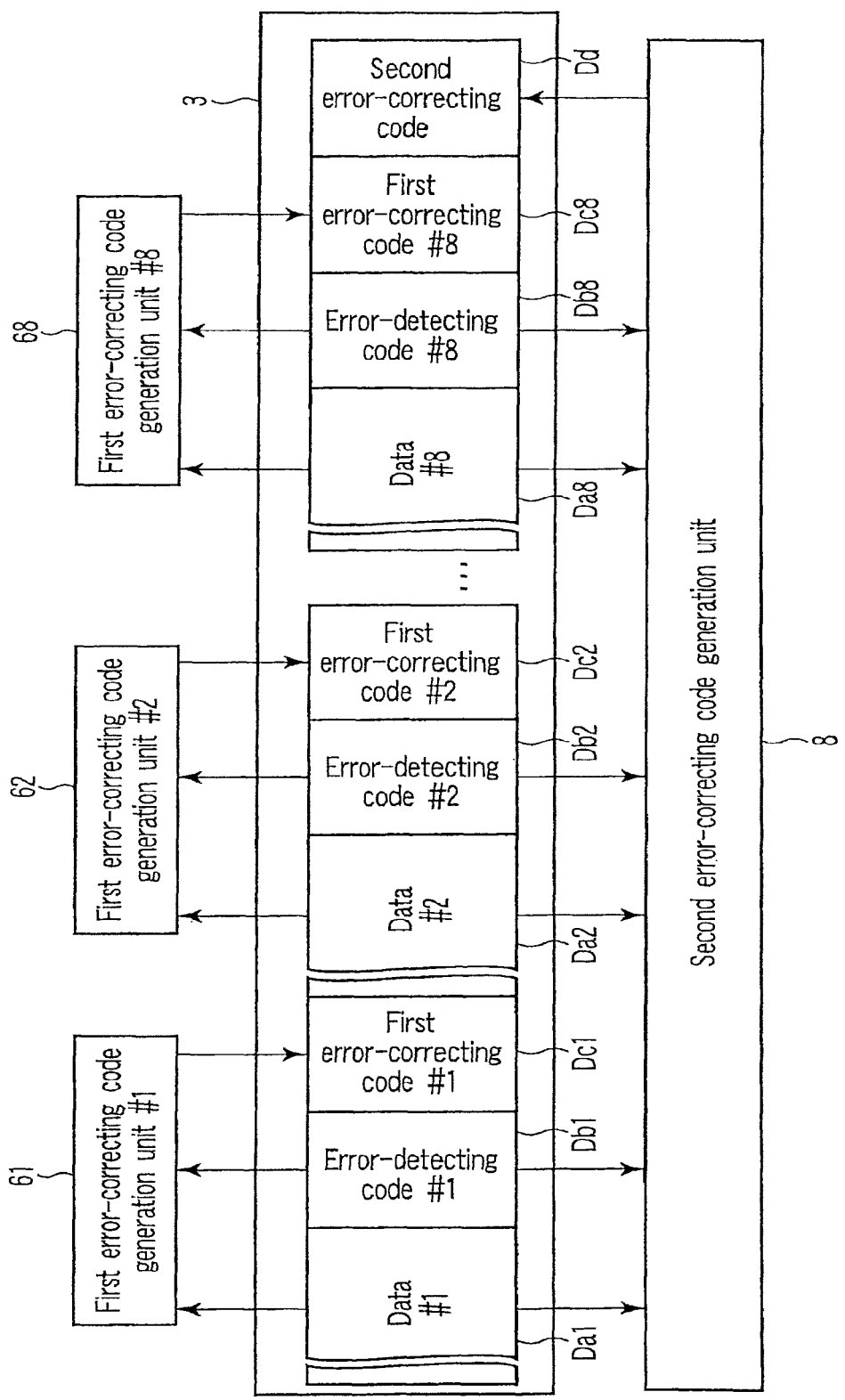
F I G. 5

SEMICONDUCTOR MEMORY DEVICE AND METHOD OF CONTROLLING THE SAME

CROSS-REFERENCE TO RELATED APPLICATIONS

This application is a continuation of and claims the benefit of priority under 35 U.S.C. § 120 to U.S. Ser. No. 17/317,280, filed May 11, 2021, which is a continuation of U.S. Ser. No. 16/357,696, filed Mar. 19, 2019, (now U.S. Pat. No. 11,038,536 issued Jun. 15, 2021), which is a continuation of U.S. Ser. No. 15/421,746, filed Feb. 1, 2017, which is continuation of U.S. Ser. No. 14/920,510, filed Oct. 22, 2015, which is a continuation of U.S. Ser. No. 14/601,664 filed Jan. 21, 2015 (now U.S. Pat. No. 9,384,090 issued Jul. 5, 2016), which is a continuation of U.S. Ser. No. 14/231,140, filed Mar. 31, 2014 (now U.S. Pat. No. 8,959,411 issued Feb. 17, 2015), which is a continuation of U.S. Ser. No. 13/757,935, filed Feb. 4, 2013, (now U.S. Pat. No. 8,732,544, issued May 20, 2014), which is a divisional of U.S. Ser. No. 13/465,624, filed May 7, 2012 (now U.S. Pat. No. 8,386,881 issued Feb. 26, 2013), which is a continuation of U.S. Ser. No. 13/090,539, filed Apr. 20, 2011 (now U.S. Pat. No. 8,196,008 issued Jun. 5, 2012), which is a continuation of U.S. Ser. No. 12/404,861, filed Mar. 16, 2009 (now U.S. Pat. No. 8,117,517 issued Feb. 14, 2012), which is a continuation of PCT Application No. PCT/JP08/063344, filed Jul. 17, 2008, which was published under PCT Article 21(2) in Japanese, and also claims the benefit of priority from Japanese Patent Application No. 2007-225996 filed Aug. 31, 2007, the entire contents of each of which are incorporated herein by reference.

BACKGROUND OF THE INVENTION

1. Field of the Invention

The present invention relates to a semiconductor memory device and a method of controlling the same and, for example, to a memory device which nonvolatilely stores information and has an error correction circuit, and a method of controlling the memory device.

2. Description of the Related Art

In some kinds of nonvolatile memory devices, the state of the physical quantity that controls data storage changes along with the elapse of time. If the elapsed time has reached a predetermined length, the data may be lost. There are various types of memory devices having such a characteristic feature. One of such memory devices is, e.g., a nonvolatile semiconductor memory device which uses transistors having a so-called laminated gate structure as memory cells.

The laminated gate structure includes a tunnel insulating film, floating gate electrode, inter-electrode insulating film, and control gate electrode which are sequentially stacked on a substrate. To store information in a memory cell, electrons are injected from the substrate to the floating gate electrode through the tunnel insulating film. The electric charges accumulated in the floating gate electrode retain information. The electric charges accumulated in the floating gate electrode leak to the substrate through the tunnel insulating film as the time elapses. For this reason, the information retained in the memory cell can be lost along with the elapse of time (an error can occur in the information).

If the elapsed time from the information storage time is short, an error can rarely occur in the information. On the other hand, if a long time has elapsed after information storage, an error may occur in the information at a high probability. A memory device having a plurality of such memory cells sometimes includes an error correction mechanism for restoring erroneous information to a correct state.

Generally, to correct a number of errors which are contained in data formed from a plurality of bits due to, e.g., the elapse of time from information recording, a correction mechanism having a high error correction capability is necessary. A correction mechanism with a high error correction capability has a large circuit scale and requires high power consumption and a long time for processing. Normally, to guarantee to restore correct information even after the elapse of a long time from information storage, a memory device uses a correction mechanism having a high error correction capability. The high-performance error correction mechanism is applied equally regardless of the length of the elapsed time from information storage.

For this reason, even in reading information which has been stored for only a short time, the high-performance error correction mechanism is used. Since the information to be read contains not so many errors, the use of the high-performance error correction mechanism is wasteful. This leads to a waste of power in the memory device.

To increase the error correction capability, generally, the size of the error correction target information needs to be large. For example, an error-correcting code is generated not for 512-byte data but for, e.g., 4-kbyte data obtained by concatenating a plurality of 512-byte data. This increases the error correction capability. In this method, however, it is necessary to always read out 4-kbyte data even in reading out 512-byte data. This also results in a waste of power in the memory device.

Prior-art reference information related to this application is

JP-A 63-275225 (KOKAI)

In the reference, a correction apparatus which has a high error correction capability is disclosed.

BRIEF SUMMARY OF THE INVENTION

According to an aspect of the present invention, there is provided a semiconductor memory device comprising: a plurality of detecting code generators configured to generate a plurality of detecting codes to detect errors in a plurality of data items, respectively; a plurality of first correcting code generators configured to generate a plurality of first correcting codes to correct errors in a plurality of first data blocks, respectively, each of the first data blocks containing one of the data items and a corresponding detecting code; a second correcting code generators configured to generate a second correcting code to correct errors in a second data block, the second data block containing the first data blocks; and a semiconductor memory configured to nonvolatilely store the second data block, the first correcting codes, and the second correcting code.

According to an aspect of the present invention, there is provided a semiconductor memory device comprising: A method of controlling a semiconductor memory device, the method comprising: generating a plurality of detecting codes to detect errors in a plurality of data items, respectively; generating a plurality of first correcting codes to correct errors in a plurality of first data block, respectively, each of the first data blocks containing one of the data items and a corresponding detecting code; generating a second correcting code to correct errors in a second data block, the second data block containing the first data blocks; and nonvolatilely storing the second data block, the first correcting codes, and the second correcting code.

BRIEF DESCRIPTION OF THE SEVERAL VIEWS OF THE DRAWING

FIG. 5 is a view illustrating a state following FIG. 4;

DETAILED DESCRIPTION OF THE INVENTION

Figure 1:
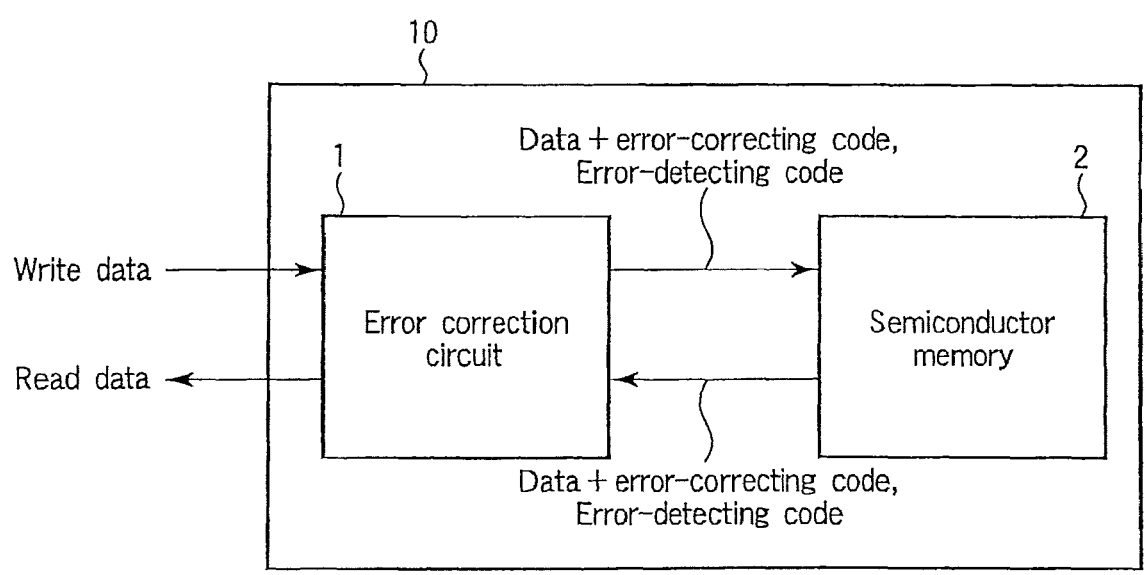
FIG. 1 is a block diagram schematically illustrating a semiconductor memory device according to an embodiment.

An embodiment of the present invention will now be described with reference to the accompanying drawing. In the following description, the same reference numerals denote constituent elements having almost the same functions and arrangements, and a repetitive explanation will be made only when necessary.

The embodiments to be described below are mere examples of an apparatus or method to embody the technical scope of the present invention. The technical scope of the present invention does not limit the materials, shapes, structures, and arrangements of the components to those described below. The technical scope of the present invention allows various changes and modifications in the appended claims.

The functional blocks of the embodiments of the present invention can be implemented by hardware, computer software, or a combination thereof. The blocks will be described below generally from the viewpoint of their functions while clarifying that they can be implemented by both of hardware and software. Whether to execute a function as hardware or software depends on the specific embodiments or design restrictions on the entire system. Those skilled in the art can implement the function by various methods for each of the specific embodiments, and the present invention incorporates such implementation.

FIG. 1 is a block diagram schematically illustrating a semiconductor memory device according to an embodiment.

As shown in FIG. 1, a semiconductor memory device 10 includes an error correction circuit 1 and a semiconductor memory 2. The error correction circuit 1 and the semiconductor memory 2 are formed as, e.g., one semiconductor integrated circuit on a single semiconductor chip. The semiconductor memory 2 can be any memory device if it can nonvolatilely store information, and the stored data can be changed. An example of the semiconductor memory 2 is a NAND flash memory.

A NAND flash memory has a plurality of memory cells. Each memory cell is formed from a MOSFET (metal oxide semiconductor field effect transistor) having a so-called laminated gate structure. A MOS transistor with the laminated gate structure includes a tunnel insulating film, floating gate electrode, inter-electrode insulating film, control gate electrode, and source and drain diffusion layers. The threshold voltage of each memory cell transistor is changed in accordance with the amount of electric charge accumulated in the floating gate electrode, and each memory cell transistor stores information corresponding to the change in the threshold voltage. The memory cell transistor can be designed to store either 1-bit information or information of a plurality of bits. A control circuit including a sense amplifier and a potential generation circuit in the semiconductor memory 2 can write data supplied to the semiconductor memory 2 in the memory cell transistors, or output data stored in the memory cell transistor outside the semiconductor memory 2.

The control gate electrodes of memory cell transistors belonging to the same row are connected to a single word line. A select gate transistor is provided at each of the ends of memory cell transistors which belong to the same column and are connected in series. One select gate transistor is connected to a bit line. Based on this rule, the memory cell transistors, select gate transistors, word lines, and bit lines are provided. Data write and read are done for each set of a plurality of memory cell transistors. A storage area formed from a set of memory cell transistors corresponds to one page. A plurality of pages form a block. The NAND flash memory erases data in each block.

Data (write data) required to be written in the semiconductor memory 2 is externally supplied to the semiconductor memory device 10. The error correction circuit 1 adds an error-correcting code and an error-detecting code to the write data and supplies it to the semiconductor memory 2. The semiconductor memory 2 stores the write data with the error-correcting code and the error-detecting code.

In response to a control signal supplied to the semiconductor memory device 10, the semiconductor memory 2 supplies data (read data) required to be read, and an error-correcting code and an error-detecting code added to the read data to the error correction circuit 1. The error correction circuit 1 detects and corrects an error in the read data. If an error exists, the error correction circuit 1 corrects it, removes the error-correcting code and the error-detecting code, and outputs the read data to an external device.

[Arrangement of Write System Circuit]

Figure 2:
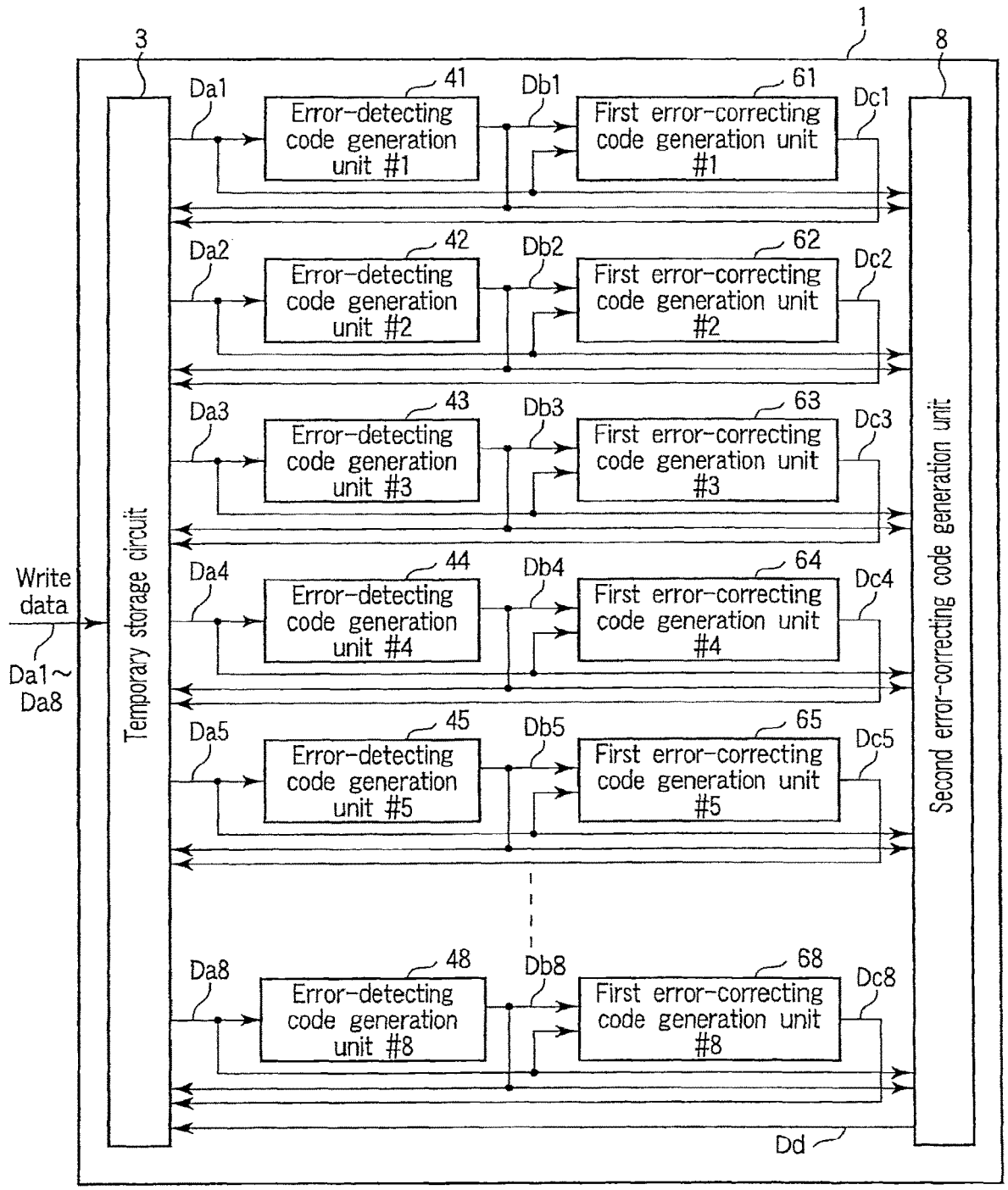
FIG. 2 is a block diagram illustrating the main portion of an error correction circuit associated with data write.

FIG. 2 is a block diagram illustrating the main portion of the error correction circuit 1 associated with data write. The error correction circuit 1 generates an error-correcting code for each of a plurality of write data each having a predetermined size and also generates another error-correcting code for the set of plurality of write data. The number of write data is decided in accordance with the error correction capability desired to achieve and the error-correcting codes to be employed. An example in which the number of write data is 8 will be described below.

As shown in FIG. 2, the error correction circuit 1 receives write data items Da1 to Da8. The first size can match, e.g., the size of write or read data of the semiconductor memory 2. More specifically, when a NAND flash memory is used as the semiconductor memory 2, the write data size corresponds to the size of one page, which is, e.g., 512 bytes. In the following example, the first size is 512 bytes, for descriptive convenience.

The error correction circuit 1 has a temporary storage circuit 3. The temporary storage circuit 3 is formed from, e.g., a volatile storage circuit and can be, e.g., a DRAM (dynamic random access memory). The temporary storage circuit 3 serves as a temporary storage area in write when generating an error-detecting code and an error-correcting code for write data to the semiconductor memory 2. In write, the temporary storage circuit 3 receives the write data items Da1 to Da8. The temporary storage circuit 3 stores the write data items Da1 to Da8.

The write data items Da1 to Da8 are supplied to error-detecting code generation units 41 to 48 (some are not illustrated), respectively.

The error-detecting code generation units 41 to 48 generate (data of) error-detecting codes Db1 to Db8 for the write data items Da1 to Da8, respectively. The error-detecting codes Db1 to Db8 are used to detect errors in the write data items Da1 to Da8. A code that allows the error-detecting code generation units to easily calculate codes and reduce the power consumption while achieving the above-described object is used as the error-detecting codes Db1 to Db8. For example, CRC (Cyclic Redundancy Checksum) 32 or CRC16 is usable as the error-detecting code. The error-detecting codes Db1 to Db8 are supplied to the temporary storage circuit 3.

The error-detecting codes Db1 to Db8 are also supplied to first error-correcting code generation units 61 to 68, respectively. The first error-correcting code generation units 61 to 68 also receive the write data items Da1 to Da8, respectively.

The first error-correcting code generation units 61 to 68 generate first error-correcting codes using the write data items Da1 to Da8 and the error-detecting codes Db1 to Db8. The first error-correcting code generated by the first error-correcting code generation unit 61 is used to correct errors in the write data item Da1 and the error-detecting code data Db1. Similarly, the first error-correcting codes generated by the first error-correcting code generation units 62 to 68 are used to correct errors in the write data items Da2 to Da8 and the error-detecting code data Db2 to Db8.

As the first error-correcting code, for example, a code which has a relatively low error correction capability of about 1 bit, requires no high power and no long time for calculation, and needs only a small scale circuit for execution is usable. More specifically, for example, a Hamming code is usable as the first error-correcting code.

The first error-correcting code generation units 61 to 68 output (data of) first error-correcting codes Dc1 to Dc8, respectively. The first error-correcting codes Dc1 to Dc8 are supplied to the temporary storage circuit 3.

The error-detecting codes Db1 to Db8 are supplied to a second error-correcting code generation unit 8. The second error-correcting code generation unit 8 also receives the write data items Da1 to Da8. The second error-correcting code generation unit 8 generates a second error-correcting code using the write data items Da1 to Da8 and the error-detecting codes Db1 to Db8. The second error-correcting code is used to correct errors in the write data items Da1 to Da8 and the error-detecting codes Db1 to Db8.

As the second error-correcting code, for example, a code which enables error correction at a higher capability than the error correction using the first error-correcting code and can correct errors of multiple bits, although the calculation amount is large, is usable. More specifically, for example, a BHC code, Reed-Solomon (RS) code, or LDPC (Low Density Parity Check) code is usable as the second error-correcting code. The circuit scale, power consumption, and calculation time of the second error-correcting code generation unit 8 exceed those of the first error-correcting code generation units 61 to 68 because of the large calculation amount. However, the second error-correcting code generation unit 8 has a higher error correction capability than the first error-correcting code generation units 61 to 68.

The second error-correcting code generation unit 8 supplies (data of) a second error-correcting code Dd to the temporary storage circuit 3. The temporary storage circuit 3 supplies, to the semiconductor memory 2, the write data items Da1 to Da8, error-detecting codes Db1 to Db8, first error-correcting codes Dc1 to Dc8, and second error-correcting code Dd, which have structures to be described later.

[Operation in Data Write]

The operation of the error correction circuit 1 in data write will be described next with reference to FIGS. 3 to 6. FIGS. 3 to 6 schematically show data states in the temporary storage circuit 3 in write sequentially.

Figure 3:
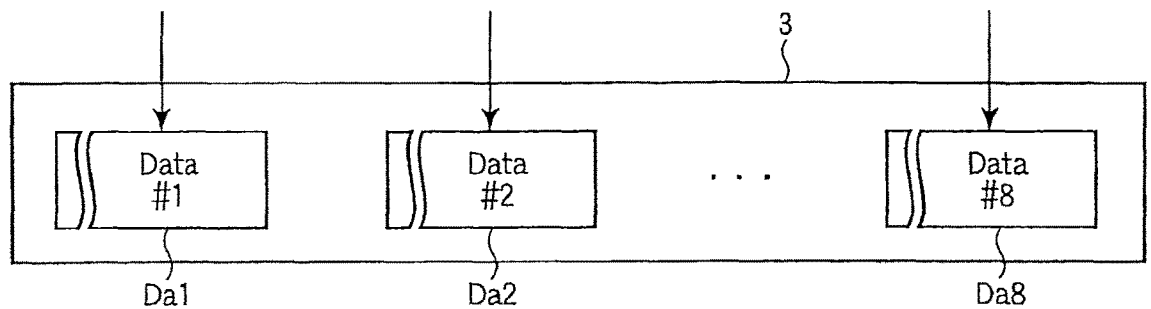
FIG. 3 is a view illustrating a data state in a temporary storage circuit 3 in write.

First, as shown in FIG. 3, the eight write data items Da1 to Da8 to be written in the semiconductor memory 2 are supplied to the error correction circuit 1. The write data items Da1 to Da8 are stored in the temporary storage circuit 3.

Figure 4:
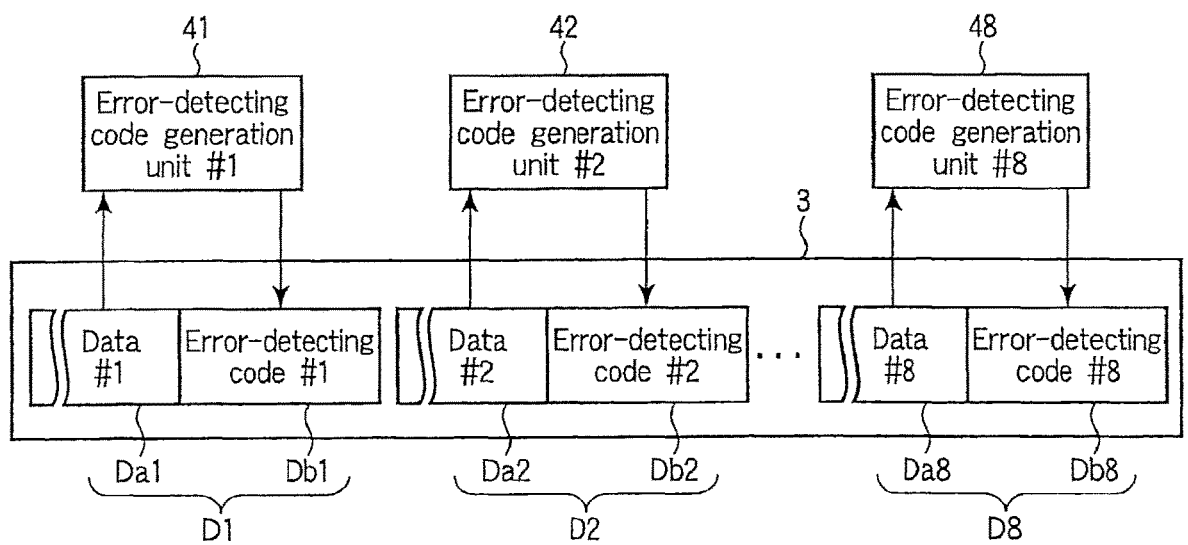
FIG. 4 is a view illustrating a state following FIG. 3.

Next, as shown in FIG. 4, the write data items Da1 to Da8 are supplied to the error-detecting code generation units 41 to 48, respectively. The error-detecting code generation units 41 to 48 generate the error-detecting codes Db1 to Db8 for the write data items Da1 to Da8, respectively. When CRC32 is used as the error-detecting codes, each of the error-detecting codes Db1 to Db8 has a size of 32 bits.

The write data item Da1 and the error-detecting code Db1 concatenated after the write data item Da1 form first data block D1 that is a unit of error correction. Similarly, the write data items Da2 to Da8 and the error-detecting codes Db2 to Db8 concatenated after them form first data blocks D2 to D8. The first data blocks D1 to D8 are stored in the temporary storage circuit 3. Those skilled in the art already know the detailed arrangement of the error-detecting code generation units 41 to 48, and a description thereof will be omitted. In this embodiment, the error-detecting code generation units 41 to 48 perform the detecting code generation operations in parallel. The parallel operations of the error-detecting code generation units 41 to 48 shorten the processing time.

Next, as shown in FIG. 5, the first data blocks D1 to D8 are supplied to the first error-correcting code generation units 61 to 68, respectively. The first error-correcting code generation unit 61 generates, using the first data block D1, the first error-correcting code Dc1 for correcting errors in the first data block D1. The first error-correcting code Dc1 is concatenated after the error-detecting code Db1 and before the write data item Da2 and stored in the temporary storage circuit 3.

Similarly, the first error-correcting code generation units 62 to 68 respectively generate, using the first data blocks D2 to D8, the first error-correcting codes Dc2 to Dc8 for correcting errors in the first data blocks D2 to D8. The first error-correcting code Dc2 is concatenated after the error-detecting code Db2 and before the write data item Da3 and stored in the temporary storage circuit 3. Similarly, the first error-correcting codes Dc3 to Dc7 are respectively concatenated after the error-detecting codes Db3 to Db7 and before the write data items Da4 to Da8 and stored in the temporary storage circuit 3. The first error-correcting code Dc8 is concatenated after the error-detecting code Db8 and stored in the temporary storage circuit 3.

When the Hamming code is used as the first error-correcting code, each of the first data blocks D1 to D8 has a size corresponding to write data (4096 bits)+error-detecting code (32 bits). To correct a 1-bit error in the first data block D1 to D8, each of the first error-correcting codes Dc1 to Dc8 has a size of, e.g., 13 bits. Those skilled in the art already know the detailed arrangement of the first error-correcting code generation units 61 to 68, and a description thereof will be omitted. In this embodiment, the first error-correcting code generation units 61 to 68 perform the correcting code generation operations in parallel. The parallel operations of the first error-correcting code generation units 61 to 68 shorten the processing time.

The first data blocks D1 to D8 are concatenated in order to form a second data block. The second data block is supplied to the second error-correcting code generation unit 8. The second data block is a unit of data to be used by the second error-correcting code generation unit to generate the second error-correcting code. The second error-correcting code generation unit 8 generates, using the second data block, the second error-correcting code Dd for correcting errors in the second data block. The second error-correcting code Dd is concatenated after the second data block and stored in the temporary storage circuit 3.

When the RS code is used as the second error-correcting code, the second data block has a size corresponding to write data (4096 bits)×8+ error-detecting code (32 bits)×8 and corrects a 12-bit error in the second data block. To correct an error having such a size in the second data block, the second error-correcting code Dd has a size of, e.g., 192 bits. Those skilled in the art already know the detailed arrangement of the second error-correcting code generation unit 8, and a description thereof will be omitted.

The second error-correcting code Dd is concatenated after the second data block in the above-described processes, thereby obtaining a transfer data block (the structure in the temporary storage circuit 3 in FIG. 5). The transfer data block is supplied to the semiconductor memory 2. The semiconductor memory 2 stores each transfer data block.

[Arrangement of Read System Circuit]

Figure 6:
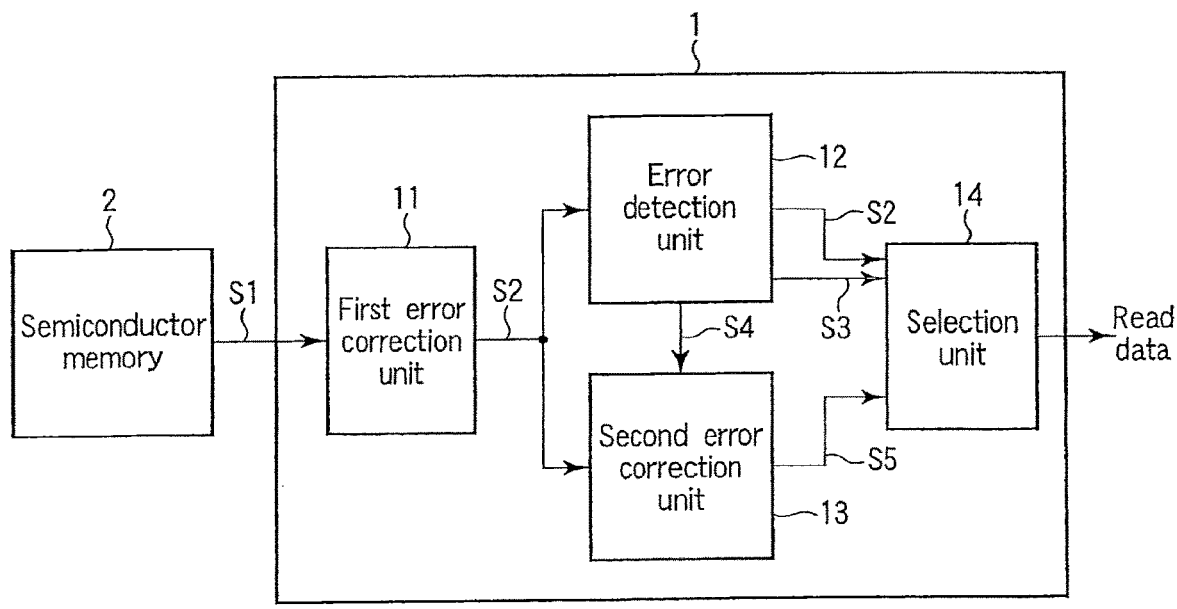
FIG. 6 is a block diagram illustrating the main portion of the error correction circuit associated with data read.

FIG. 6 is a block diagram illustrating the main portion of the error correction circuit 1 associated with data read.

As shown in FIG. 6, the semiconductor memory 2 supplies a signal S1 to a first error correction unit 11. The signal S1 is formed from a transfer data block (the structure in the temporary storage circuit 3 in FIG. 5).

If the first data blocks D1 to D8 contain errors, the first error correction unit 11 corrects the errors in the first data blocks D1 to D8 using the first error-correcting codes Dc1 to Dc8 in the signal S1, respectively, within the bounds of the capability of the first error correction unit 11. More specifically, the first error correction unit 11 corrects the errors in the first data block D1 using the first error-correcting code Dc1. Similarly, the first error correction unit 11 corrects the errors in the first data blocks D2 to D8 using the error-correcting codes Dc2 to Dc8, respectively, within the bounds of the capability of the first error correction unit 11.

The first error correction unit 11 outputs a signal S2 obtained by correcting the errors in the signal S1 using the first error-correcting codes. If the number of error bits in the first data blocks D1 to D8 before error correction is equal to or less than the error correction capability of the first error correction unit 11, the first data blocks D1 to D8 in the signal S2 after error correction contain no errors. However, if the number of error bits in the first data blocks D1 to D8 before error correction exceeds the error correction capability of the first error correction unit 11, the first data blocks D1 to D8 in the signal S2 after error correction still contain errors.

The signal S2 is supplied to an error detection unit 12 and a second error correction unit 13. The error detection unit 12 detects errors in the write data items Da1 to Da8 using the error-detecting codes Db1 to Db8. The error detection unit 12 directly supplies the signal S2 to a selection unit 14. The error detection unit 12 also supplies, to the selection unit 14, a signal S3 representing the presence/absence of error detection in all the first data blocks D1 to D8. The error detection unit 12 supplies, to the second error correction unit 13, a signal S4 containing information representing error detection locations in the first data blocks D1 to D8 in addition to the presence/absence of error detection.

The second error correction unit 13 analyzes the signal S4 and acquires information representing whether errors are detected upon error detection by the error detection unit 12. If no errors are detected, error correction is not necessary any more. For example, the second error correction unit 13 stops the operation for the signal S2 of the process target as power supply from a power supply circuit (not shown) or clock signal supply from a clock circuit (not shown) stops.

Figure 7:
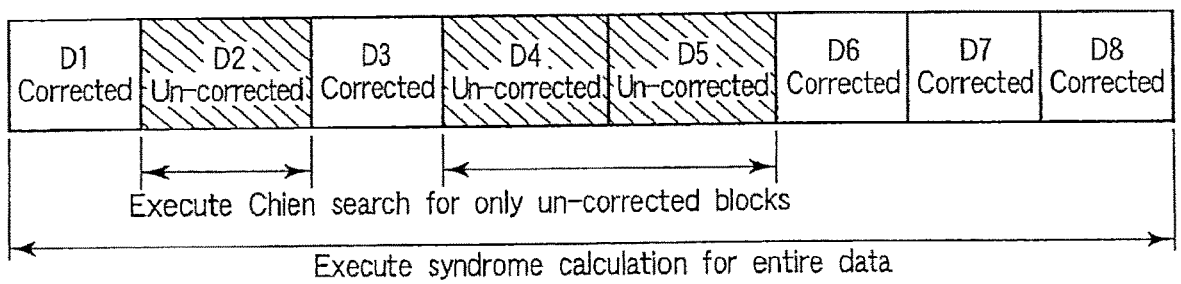
FIG. 7 is a view illustrating an example of the operation of a second error correction unit.

Upon analyzing the signal S4 and acquiring information representing that errors are detected in the signal S2, the second error correction unit 13 corrects the errors in the first data blocks D1 to D8 using the second error-correcting code Dd. At this time, the second error correction unit 13 executes error correction for only the first data blocks D1 to D8 containing errors. FIG. 7 shows an example of this state.

FIG. 7 shows an example in which errors are detected in the first data blocks D2, D4, and D5. The second error correction unit 13 executes syndrome calculation using the second error-correcting code Dd for all the first data blocks D1 to D8. On the other hand, the second error correction unit 13 executes Chien search for only the first data blocks D2, D4, and D5 containing the detected errors. The second error correction unit 13 corrects the errors in the first data blocks D2, D4, and D5 using the second error-correcting code Dd. The second error correction unit 13 outputs a signal S5 obtained by correcting the errors in the signal S2 using the second error-correcting code.

Error correction by the second error correction unit 13 is sequentially executed for the errors detected in the first data blocks D1 to D8, unlike the prior art. That is, no error correction circuit dedicated to each of the first data blocks D1 to D8 is provided. This reduces the circuit scale and power consumption of the second error correction unit 13.

Depending on the number of first data blocks to be subjected to error correction, the necessary time may be longer than in parallel error correction by the dedicated circuits of the first data blocks D1 to D8. In this embodiment, however, the second error correction unit 13 executes Chien search for only, of the first data blocks D1 to D8, data blocks containing detected errors. In addition, the first error-correcting code is designed to be able to correct most (nearly 100%) of the errors in the first data blocks D1 to D8 by only correction using the first error-correcting code. For this reason, the second error-correcting code is rarely used. In this embodiment, it is therefore possible to reduce the circuit scale and power consumption of the second error correction unit 13 without any increase in the processing time by sharing the error correction circuit for the first data blocks D1 to D8.

Assume that in a process of repeatedly reading certain a transfer data block from the memory device, the error detection unit 12 detects no error in the transfer data block which is read for the first time. In this case, at least one of power supply and clock signal supply to the second error correction unit 13 is stopped in advance in reading the transfer data block for the second and subsequent times. This largely reduces the power consumption in the error correction circuit 1 in reading the same transfer data block.

How to decide the correction capability of the first error correction unit 11 and that of the error detection unit 12 will be described next. Note that the correction capability of the first error correction unit 11 also includes the process of causing the first error-correcting code generation units 61 to 68 to generate the first error-correcting codes Dc1 to Dc8. Similarly, the correction capability of the second error correction unit 13 also includes the process of causing the second error-correcting code generation unit 8 to generate the second error-correcting code Dd.

Figure 8:
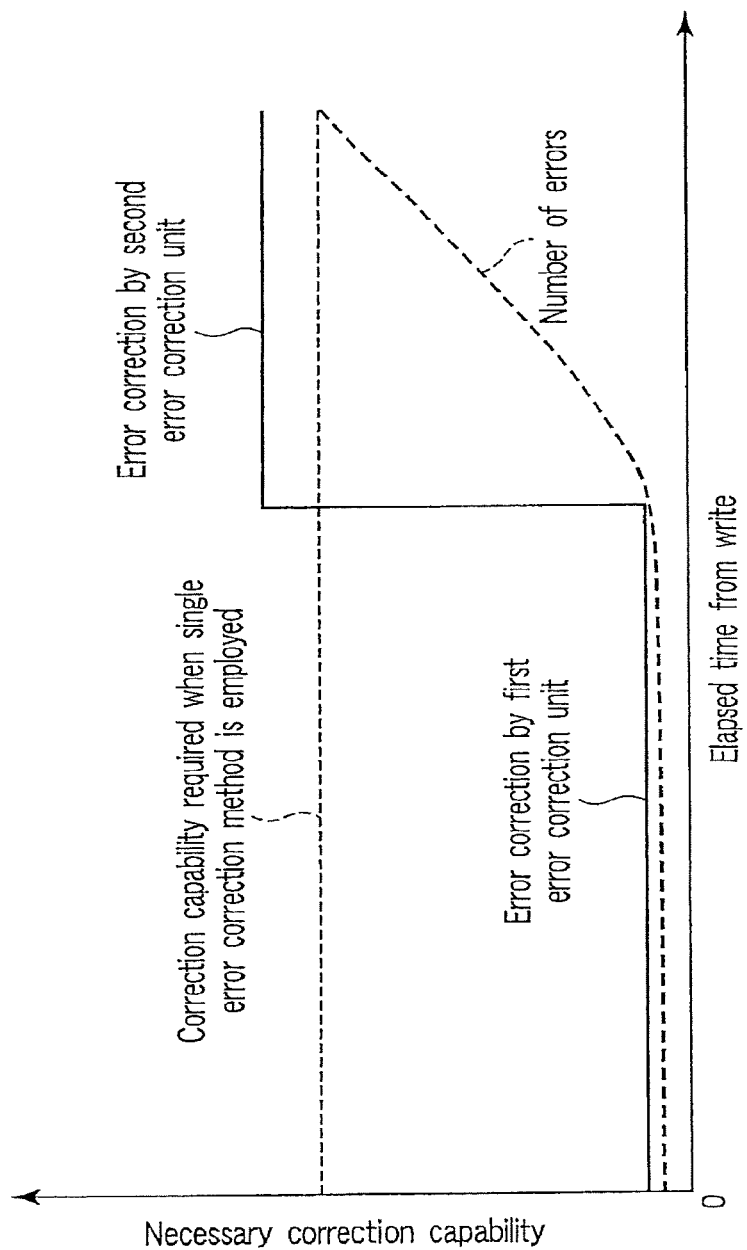
FIG. 8 is a graph illustrating the relationship between the necessary correction capability and the elapsed time from write.

FIG. 8 is a graph illustrating the relationship between the necessary correction capability and the elapsed time from data write in the semiconductor memory 2. As shown in FIG. 8, as the elapsed time becomes long, the number of errors in the data written in the semiconductor memory 2 increases. The error correction capability is changed in accordance with the increase in the number of errors. The error correction capability of the first error correction unit 11 and that of the second error correction unit 13 are decided so that an excessive or insufficient error correction capability are used. More specifically, the error correction capability of the first error correction unit 11 and that of the second error correction unit 13 are decided such that error correction can be done solely by the first error correction unit 11 when the elapsed time is short, while the first error correction unit 11 and the second error correction unit 13 can execute error correction when the elapsed time exceeds a predetermined time (the time when the number of errors abruptly increases).

Figure 9:
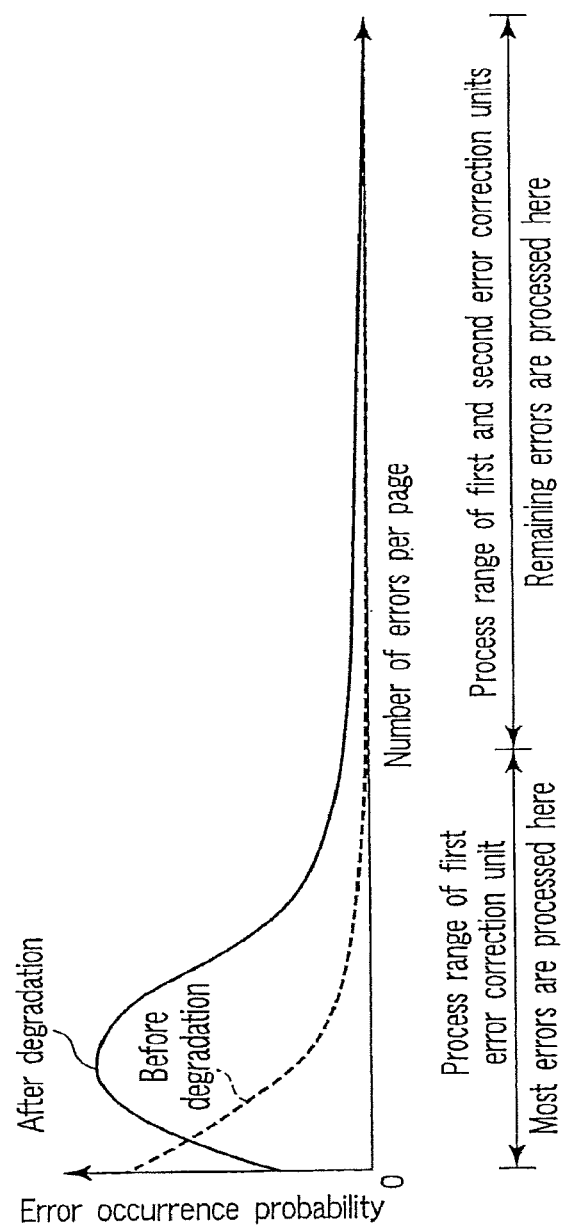
FIG. 9 is a view illustrating the concept of the process range of a first error correction unit 11 and that of the second error correction unit 13.

FIG. 9 shows the concept of the process range of the first error correction unit 11 and that of the second error correction unit 13 according to this embodiment. The abscissa in FIG. 9 represents the number of errors within a predetermined range (a page of a NAND flash memory) of the semiconductor memory 2. The ordinate represents the error occurrence probability. The broken line indicates the relationship before degradation of the semiconductor memory 2 (immediately after write). The solid line indicates the relationship after degradation of the semiconductor memory 2 (after the guaranteed data retention time has elapsed).

As shown in FIG. 9, the error correction capability of the first error correction unit 11 is decided such that only the first error correction unit 11 can correct all errors when the number of errors within the predetermined range is small. More specifically, the number of correctable bits, error correction method, and the number of bits of an error-correcting code are decided. For example, the error correction capability of the first error correction unit 11 is decided such that it can correct almost 100% of errors before degradation and about 99% of errors after degradation. On the other hand, the error correction capability of the second error correction unit 13 is decided to correct the remaining 1% of errors after degradation.

Figure 10:
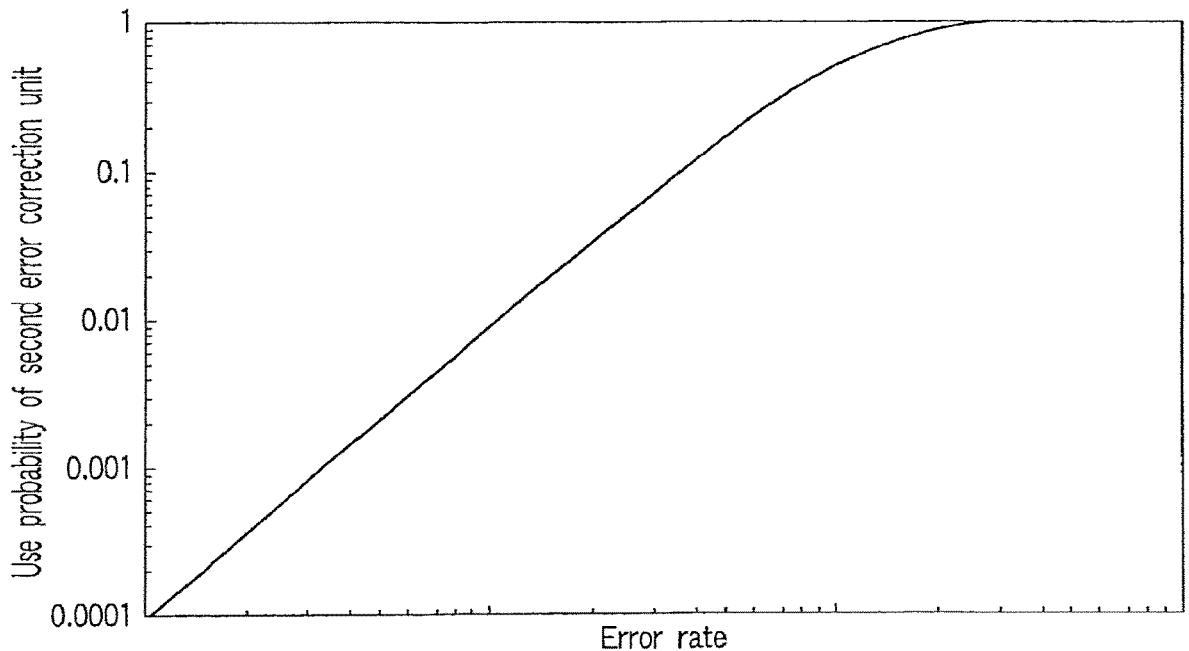
FIG. 10 is a graph illustrating the relationship between the error rate and the use probability of the second error correction unit.

As a result, the use probability of the second error correction unit 13 rises along with the increase in the error rate, as shown in FIG. 10.

As described above, the first error correction unit 11, which has a lower error correction capability but requires a shorter processing time and lower power consumption, corrects almost all errors. The second error correction unit 13, which requires a longer processing time and higher power consumption but has a higher error correction capability, corrects the remaining errors. The error correction circuit 1 can therefore achieve a short processing time, low power consumption, and small circuit scale while maintaining a high error correction capability.

Figure 11:
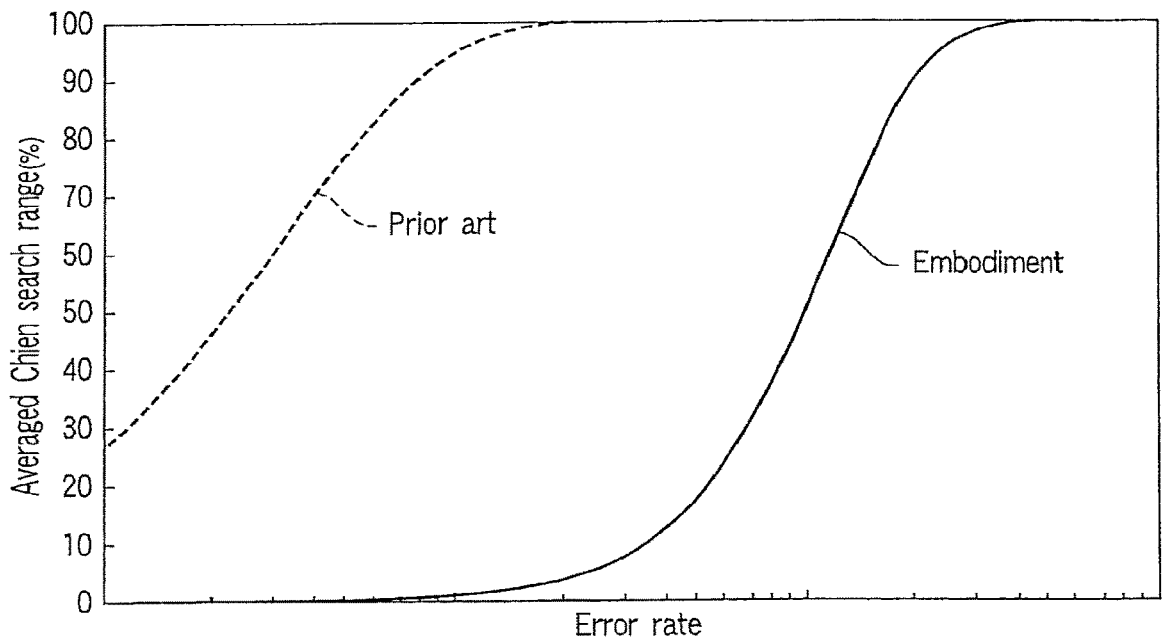
FIG. 11 is a graph illustrating the relationship between the error rate and averaged Chien search of the second error correction unit.

FIG. 11 shows the relationship between the error rate and the averaged Chien search range of the second error correction unit 13. In this embodiment (solid line), the error correction capability of the first error correction unit 11 is set such that most errors can be corrected by only the first error correction unit 11, as described above. For this reason, even when the error rate is high, the second error correction unit 13 is rarely involved in error correction, as compared to the prior art (broken line).

As described above, according to the semiconductor memory device of the embodiment, the plurality of first data blocks D1 to D8 each containing a corresponding one of a plurality of write data items are formed. The plurality of first error-correcting codes Dc1 to Dc8 are generated for the plurality of first data blocks D1 to D8, respectively. Additionally, the second error-correcting code Dd is generated for a second data block formed from the plurality of first data blocks D1 to D8. When the number of error bits is small, correction is done using the first error-correcting codes Dc1 to Dc8 which have a low capability but require low power consumption and a small circuit scale. When the number of error bits is large, correction is done using both the first error-correcting codes Dc1 to Dc8 and the second error-correcting code Dd which requires high power consumption and a large circuit scale but allows correction with a high capability. Hence, there is provided a semiconductor memory device whose error correction circuit 1 has an appropriate circuit scale and power consumption and shortens the error correction time without sacrificing the error correction capability.

In this embodiment, error correction using the second error-correcting code Dd is executed for, of the first data blocks D1 to D8, only data containing errors even after error correction using the first error-correcting codes Dc1 to Dc8. This can greatly reduce the circuit scale of the second error correction unit 13 as compared to an example in which circuits for executing error correction using the second error-correcting code Dd are provided in correspondence with the plurality of first data blocks D1 to D8.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
   a flash memory; and
   a circuit configured to:
   generate a plurality of error detection codes to detect an error in a plurality of data items, respectively;
   generate a plurality of first error correction codes to correct an error in a plurality of first data blocks, respectively, each of the plurality of first data blocks including one of the plurality of data items and one of the plurality of error detection codes corresponding thereto;

generate a second error correction code to correct an error in a second data block, the second data block including at least a part of each of the plurality of first data blocks; and write the plurality of first data blocks, the plurality of first error correction codes, and the second error correction code into the flash memory.

2. The memory system according to claim 1, wherein a size of each of the plurality of first data blocks is smaller than a size of the second data block.

3. The memory system according to claim 1, wherein a size of each of the plurality of first error correction codes is smaller than a size of the second error correction code.

4. The memory system according to claim 1, wherein the plurality of data items include at least a third data item, the plurality of error detection codes include at least a third error detection code, the plurality of first data blocks include at least a third data block, the third data block including the third data item and the third error detection code, the plurality of first error correction codes include at least a third error correction code, the third error correction code being for the third data block, and the circuit is further configured to:

correct, by using the third error correction code, an error in the third data block read from the flash memory; and determine, by using the third error detection code, whether the error in the third data block has been corrected.

5. The memory system according to claim 4, wherein the circuit is further configured to correct, by using the second error correction code, an error in the second data block that includes the at least a part of each of the plurality of first data blocks read from the flash memory.

6. The memory system according to claim 5, wherein the plurality of data items further include a fourth data item, the plurality of error detection codes further include a fourth error detection code, the plurality of first data blocks further include a fourth data block, the fourth data block including the fourth data item and the fourth error detection code, the plurality of first error correction codes further include a fourth error correction code, the fourth error correction code being for the fourth data block, and the circuit is configured to, in correcting the error in the second data block, execute different operations for data included in the third data block from which the error has been corrected by using the third error correction code and for data included in the fourth data block for which the circuit has failed to correct an error by using the fourth error correction code.

7. The memory system according to claim 6, wherein the circuit is configured to, in correcting the error in the second data block:

not execute a Chien search for the data included in the third data block from which the error has been corrected by using the third error correction code; and execute the Chien search for the data included in the fourth data block for which the circuit has failed to correct the error by using the fourth error correction code.

8. The memory system according to claim 5, wherein the plurality of data items further include a fourth data item, the plurality of error detection codes further include a fourth error detection code, the plurality of first data blocks further include a fourth data block, the fourth data block including the fourth data item and the fourth error detection code, the plurality of first error correction codes further include a fourth error correction code, the fourth error correction code being for the fourth data block, and the circuit is configured to, in correcting the error in the second data block:

perform a first operation on data included in the fourth data block for which the circuit has failed to correct an error by using the fourth error correction code, and skip at least a part of the first operation on data included in the third data block from which the error has been corrected by using the third error correction code.

9. The memory system according to claim 5, wherein the circuit includes:

a first correction circuit configured to correct, by using the third error correction code, the error in the third data block;

a detection circuit configured to determine, by using the third error detection code, whether the error in the third data block has been corrected; and a second correction circuit configured to correct, by using the second error correction code, the error in the second data block, and the detection circuit is further configured to send, to the second correction circuit, a signal that indicates whether the error in the third data block has been corrected.

10. The memory system according to claim 5, wherein a first time period is shorter than a second time period, the first time period is a time period for correcting the error in the third data block, the first time period including a third time period for reading the third data block from the flash memory, and the second time period is a time period for correcting the error in the second data block, the second time period including a fourth time period for reading the second data block from the flash memory.

11. A method of controlling a flash memory, comprising:

generating a plurality of error detection codes to detect an error in a plurality of data items, respectively;

generating a plurality of first error correction codes to correct an error in a plurality of first data blocks, respectively, each of the plurality of first data blocks including one of the plurality of data items and one of the plurality of error detection codes corresponding thereto;

generating a second error correction code to correct an error in a second data block, the second data block including at least a part of each of the plurality of first data blocks; and writing the plurality of first data blocks, the plurality of first error correction codes, and the second error correction code into the flash memory.

12. The method according to claim 11, wherein a size of each of the plurality of first data blocks is smaller than a size of the second data block.

13. The method according to claim 11, wherein a size of each of the plurality of first error correction codes is smaller than a size of the second error correction code.

14. The method according to claim 11, wherein
the plurality of data items include at least a third data item,
the plurality of error detection codes include at least a third error detection code,
the plurality of first data blocks include at least a third data block, the third data block including the third data item and the third error detection code,
the plurality of first error correction codes include at least a third error correction code, the third error correction code being for the third data block, and
the method further comprises:
  correcting, by using the third error correction code, an error in the third data block read from the flash memory; and
  determining, by using the third error detection code, whether the error in the third data block has been corrected.

15. The method according to claim 14, further comprising correcting, by using the second error correction code, an error in the second data block that includes the at least a part of each of the plurality of first data blocks read from the flash memory.

16. The method according to claim 15, wherein
the plurality of data items further include a fourth data item,
the plurality of error detection codes further include a fourth error detection code,
the plurality of first data blocks further include a fourth data block, the fourth data block including the fourth data item and the fourth error detection code,
the plurality of first error correction codes further include a fourth error correction code, the fourth error correction code being for the fourth data block, and
the method further comprises, in correcting the error in the second data block, executing different operations for data included in the third data block from which the error has been corrected by using the third error correction code and for data included in the fourth data block for which the circuit has failed to correct an error by using the fourth error correction code.

17. The method according to claim 16, further comprising, in correcting the error in the second data block:
  not executing a Chien search for the data included in the third data block from which the error has been corrected by using the third error correction code; and
  executing the Chien search for the data included in the fourth data block for which the circuit has failed to correct the error by using the fourth error correction code.

18. The method according to claim 15, wherein
the plurality of data items further include a fourth data item,
the plurality of error detection codes further include a fourth error detection code,
the plurality of first data blocks further include a fourth data block, the fourth data block including the fourth data item and the fourth error detection code,
the plurality of first error correction codes further include a fourth error correction code, the fourth error correction code being for the fourth data block, and
the method further comprises, in correcting the error in the second data block:
  performing a first operation on data included in the fourth data block for which the circuit has failed to correct an error by using the fourth error correction code, and
  skipping at least a part of the first operation on data included in the third data block from which the error has been corrected by using the third error correction code.

19. The method according to claim 15, wherein
the method is performed by a circuit that includes:
  a first correction circuit configured to correct, by using the third error correction code, the error in the third data block;
  a detection circuit configured to determine, by using the third error detection code, whether the error in the third data block has been corrected; and
  a second correction circuit configured to correct, by using the second error correction code, the error in the second data block, and
the detection circuit is further configured to send, to the second correction circuit, a signal that indicates whether the error in the third data block has been corrected.

20. The method according to claim 15, wherein
a first time period is shorter than a second time period,
the first time period is a time period for correcting the error in the third data block, the first time period including a third time period for reading the third data block from the flash memory, and
the second time period is a time period for correcting the error in the second data block, the second time period including a fourth time period for reading the second data block from the flash memory.

* * * * *